United States Patent
Roozen et al.

(10) Patent No.: US 7,053,616 B2
(45) Date of Patent: May 30, 2006

(54) MRI SYSTEM HAVING A GRADIENT MAGNET SYSTEM WITH A BALANCE MEMBER

(75) Inventors: Nicolaas Bernardus Roozen, Eindhoven (NL); Cornelis Leonardus Gerardus Ham, Eindhoven (NL); Paul Royston Harvey, Eindhoven (NL); Patrick Willem Paul Limpens, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/533,991

(22) PCT Filed: Oct. 27, 2003

(86) PCT No.: PCT/IB03/04816

§ 371 (c)(1),
(2), (4) Date: May 5, 2005

(87) PCT Pub. No.: WO2004/046744

PCT Pub. Date: Jun. 3, 2004

(65) Prior Publication Data

US 2005/0285594 A1 Dec. 29, 2005

(30) Foreign Application Priority Data

Nov. 15, 2003 (EP) .................................. 02079768

(51) Int. Cl.
*G01V 3/00* (2006.01)
(52) U.S. Cl. ...................................... 324/318; 324/322
(58) Field of Classification Search ................. 324/318, 324/322

See application file for complete search history.

(56) References Cited

U.S. PATENT DOCUMENTS 5,548,653 A * 8/1996 Pla et al. .................... 381/71.2
5,617,026 A 4/1997 Yoshino et al.
5,841,279 A 11/1998 Hayashi et al.

(Continued)

FOREIGN PATENT DOCUMENTS

WO    WO 02/44745 A1    6/2002

*Primary Examiner*—Louis M. Arana
(74) *Attorney, Agent, or Firm*—Thomas M. Lundin

(57) ABSTRACT

The invention relates to a magnetic resonance imaging (MRI) system (1) comprising an examination volume (11), a main magnet system (13) for generating a main magnetic field ($B_0$) in the examination volume in a Z-direction, a gradient magnet system (19) for generating gradients of the main magnetic field, and an anti-vibration system (33) for reducing vibrations of the gradient magnet system caused by a mechanical load ($M_X$, $M_Y$) exerted on the gradient magnet system as a result of electromagnetic interaction between the main magnetic field and electrical currents in the gradient magnet system. According to the invention the anti-vibration system (33) comprises a balance member (39), which is coupled to the gradient magnet system (19) by means of an actuator system (51) and a coupling device (49) allowing displacements of the balance member relative to the gradient magnet system. The MRI system (1) also has a control system (81) which controls the actuator system in such a manner that the actuator system exerts upon the balance member a compensating mechanical load ($M_{CX}$, $M_{CY}$) which substantially corresponds to the mechanical load ($M_X$, $M_Y$) exerted on the gradient magnet system. As a result, the actuator system exerts a mechanical reaction load ($M_{RX}$, $M_{RY}$) on the gradient magnet system which has the same magnitude as but is oppositely directed to the mechanical load ($M_X$, $M_Y$) exerted on the gradient magnet system, so that vibrations of the gradient magnet system are effectively limited.

12 Claims, 3 Drawing Sheets

U.S. PATENT DOCUMENTS

Figure 1:
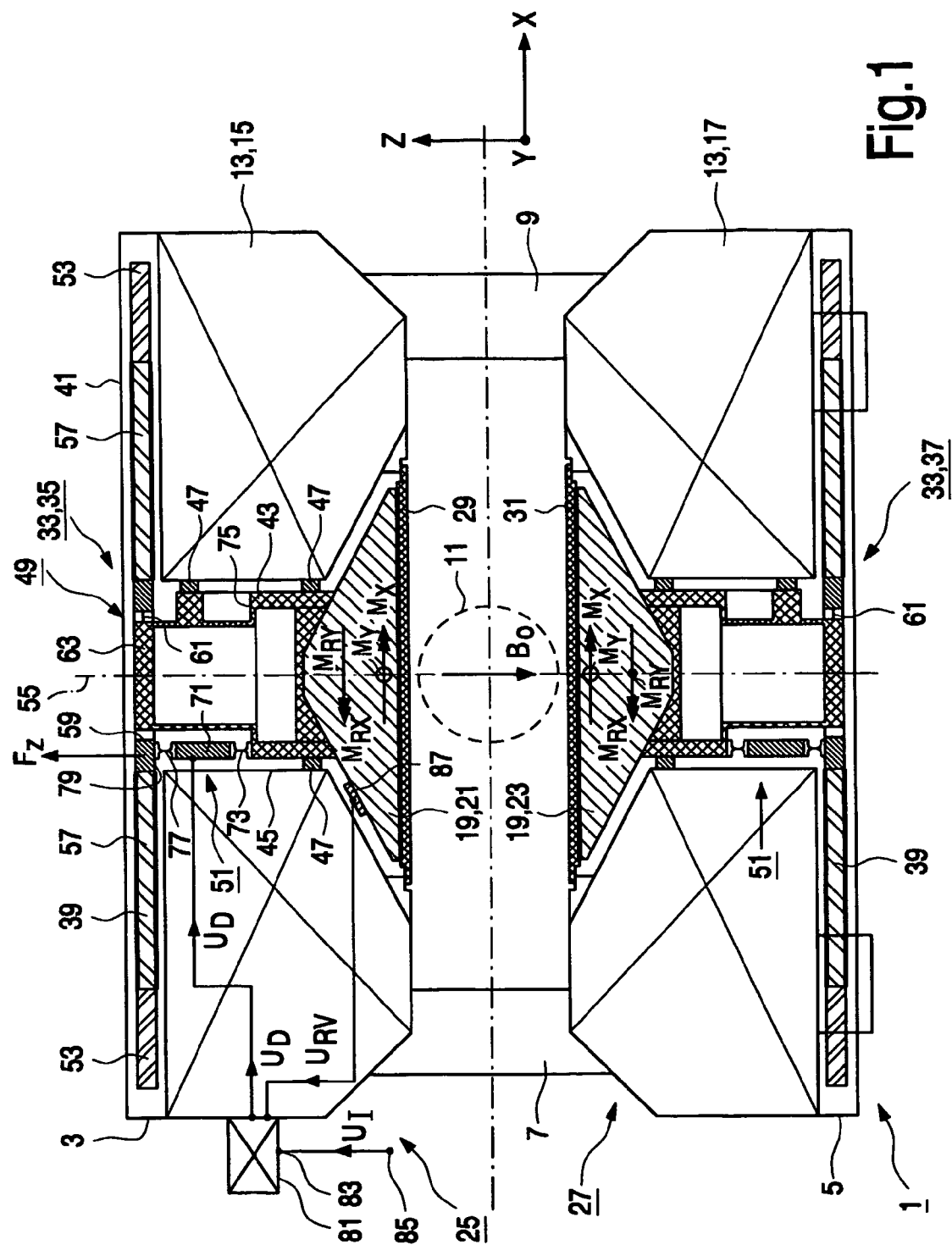

| | | | |
|---|---|---|---|
| 6,169,404 B1 * | 1/2001 | Eckels | 324/320 |
| 6,396,272 B1 | 5/2002 | Dietz et al. | |
| 6,774,633 B1 * | 8/2004 | Wang et al. | 324/318 |
| 6,822,446 B1 * | 11/2004 | Havens et al. | 324/309 |
| 6,894,498 B1 * | 5/2005 | Edelstein | 324/318 |
| 2002/0079895 A1 | 6/2002 | Roozen et al. | |

* cited by examiner

MRI SYSTEM HAVING A GRADIENT MAGNET SYSTEM WITH A BALANCE MEMBER

The invention relates to a magnetic resonance imaging (MRI) system comprising an examination volume, a main magnet system for generating a main magnetic field in the examination volume in a Z-direction, a gradient magnet system for generating gradients of the main magnetic field, and an anti-vibration system for reducing vibrations of the gradient magnet system caused, during operation, by a mechanical load exerted on the gradient magnet system as a result of electromagnetic interaction between the main magnetic field and electrical currents in the gradient magnet system.

An MRI system of the kind mentioned in the opening paragraph is known from U.S. Pat. No. 5,617,026. The known MRI system is used to make images of the internal organs of a patient by means of a nuclear magnetic resonance method. In the known MRI system the main magnet system comprises a number of superconducting electrical coils which are accommodated in a cryogenic container. Consequently, the main magnetic field generated by the main magnet system is relatively strong, as a result of which strong nuclear magnetic resonance effects are achieved. The gradient magnet system comprises a number of electrical coils for generating gradients of the main magnetic field in three orthogonal directions. An image of the patient's body is constructed by successively observing nuclear magnetic resonance effects in a large number of positions in the patient's body which are successively selected by altering said gradients. To achieve an acceptable overall period of time necessary for the examination, the gradients of the main magnetic field are altered at relatively high frequencies, as a result of which the electrical currents in the coils of the gradient magnet system also alter at high frequencies.

Because of the electromagnetic interaction between the main magnetic field and the altering electrical currents in the gradient magnet system, altering mechanical loads, in particular Lorentz forces, are exerted on the gradient magnet system during operation of the known MRI system. Without additional measures said mechanical loads would result in mechanical and acoustic vibrations of the gradient magnet system, and said vibrations would result in distortions of the images generated by the MRI system and in inadmissibly strong acoustic noise in the examination volume and around the MRI system. The known MRI system comprises an anti-vibration system for reducing said vibrations of the gradient magnet system. Said anti-vibration system comprises a plurality of piezo-electric devices which are embedded in the cylindrical carrier of the coils of the gradient magnet system. During operation said piezo-electric devices are energized in such a manner that local deformations of the carrier, which are caused by the mechanical loads, in particular the Lorentz forces, exerted on the coils of the gradient magnet system are cancelled by compensating deformations of the piezo-electric devices. Although the mechanical and acoustic vibrations of the gradient magnet system are reduced to some extent as a result of said compensating deformations, the level of the residual mechanical and acoustic vibrations of the gradient magnet system of the known MRI system is still considerable.

It is an object of the invention to provide a magnetic resonance imaging (MRI) system of the kind mentioned in the opening paragraph in which, during operation, mechanical and acoustic vibrations caused by mechanical loads exerted on the gradient magnet system are further reduced, so that inadmissible distortions of the images generated by the MRI system and inadmissible acoustic vibrations in and around the MRI system are prevented as much as possible.

To achieve said object, a magnetic resonance imaging (MRI) system according to the invention is characterized in that the anti-vibration system comprises a balance member, which is coupled to the gradient magnet system by means of an actuator system and a coupling device allowing displacements of the balance member relative to the gradient magnet system, the MRI system having a control system for controlling the actuator system in such a manner that, during operation, the actuator system exerts upon the balance member a compensating mechanical load which substantially corresponds to the mechanical load exerted on the gradient magnet system. As a result of the fact that said actuator system exerts said compensating mechanical load on said balance member, said actuator system exerts a mechanical reaction load on the gradient magnet system which is substantially equal but oppositely directed to the mechanical load which is exerted on the gradient magnet system as a result of the electromagnetic interaction between the main magnetic field and the electrical currents in the gradient magnet system. Consequently, the mechanical load resulting from said electromagnetic interaction is substantially cancelled by said mechanical reaction load, so that mechanical and acoustic vibrations resulting from said mechanical load are effectively reduced. The coupling device is such that it provides sufficient freedom of movement of the balance member relative to the gradient magnet system, so that the compensating mechanical load exerted on the balance member is converted into displacements of the balance member relative to the gradient magnet system. The balance member has a sufficiently large mass and/or moment of inertia, so that the resultant displacements and vibrations of the balance member are limited as much as possible.

A particular embodiment of an MRI system according to the invention is characterized in that, during operation, the control system applies a control signal to the actuator system corresponding to the compensating mechanical load, the control system determining said control signal as a function of the value of the electrical currents in the gradient magnet system. Since the main magnetic field has a predetermined strength and orientation and the momentary electrical currents in the gradient magnet system are determined by a pulse sequence control unit of the MRI system, the mechanical load exerted on the gradient magnet system as a result of the electromagnetic interaction between the main magnetic field and the electrical currents in the gradient magnet system and the necessary compensating mechanical load can be accurately predicted by the control system. As a result, this particular embodiment provides an accurate compensation of the mechanical loads exerted on the gradient magnet system, so that the efficiency of the anti-vibration system is further improved.

A further embodiment of an MRI system according to the invention is characterized in that the gradient magnet system comprises a sensor system which, during operation, measures residual vibrations of the gradient magnet system and which applies a measuring signal to the control system corresponding to the measured residual vibrations, the control system adjusting the control signal in such a manner that the measured residual vibrations are smaller than a predetermined threshold value. In this further embodiment residual vibrations of the gradient magnet system, which may be present, for example, due to small differences between the actual mechanical loads on the gradient magnet system and the mechanical loads predicted by the control system, are effectively cancelled by the control system in cooperation with the sensor system. The efficiency of the anti-vibration system is thus further improved.

A particular embodiment of an MRI system according to the invention is characterized in that the actuator system comprises piezo-electric actuators. The presence of the piezo-electric actuators in the MRI system has substantially no effect on the magnetic field in the examination volume as a result of the absence of electrically conductive materials in said actuators. Furthermore, the control signals by means of which the piezo-electric actuators are actuated have relatively small current values, so that the control signals cause only relatively small disturbing magnetic fields.

A particular embodiment of an MRI system according to the invention is characterized in that the balance member comprises an electrically conductive portion which is positioned in a portion of the magnetic field of the main magnet system. When the balance member is displaced relative to the gradient magnet system as a result of the compensating mechanical load exerted thereon, eddy currents are generated in said electrically conductive portion by the magnetic field of the main magnet system. As a result of the electromagnetic interaction between said magnetic field and said eddy currents Lorentz forces are exerted on said electrically conductive portion in a direction opposite to the direction in which the balance member is displaced, so that the displacements and vibrations of the balance member relative to the gradient magnet system are effectively damped. As a result, the efficiency of the anti-vibration system is further improved. Said damping effect becomes considerable when suitable dimensions of the electrically conductive portion and a suitable orientation of the electrically conductive portion in the magnetic field of the main magnet system are chosen, so that the mass and/or moment of inertia of the balance member necessary to sufficiently limit the displacements and vibrations of the balance member can be reduced.

A particular embodiment of an MRI system according to the invention is characterized in that the MRI system has a first magnet unit and a second magnet unit at a distance from the first magnet unit, the examination volume being present between the first and the second magnet unit, wherein the first and the second magnet unit comprise a first portion and a second portion, respectively, of the main magnet system and a first portion and a second portion, respectively, of the gradient magnet system, and wherein the first and the second portion of the gradient magnet system are each coupled to a separate balance member by means of a separate actuator system and a separate coupling device allowing at least rotations of the respective balance member relative to the respective portion of the gradient magnet system about a first and a second axis of rotation which are mutually perpendicular and perpendicular to the Z-direction, the control system controlling each actuator system in such a manner that, during operation, each actuator system exerts upon the respective balance member at least compensating mechanical torques about the first and the second axis of rotation which substantially correspond to mechanical torques exerted on the respective portion of the gradient magnet system as a result of the electromagnetic interaction between the main magnetic field and the electrical currents in the respective portion of the gradient magnet system. In this particular embodiment the MRI system is of a so-called open type, wherein the examination volume is easily accessible for the patient and for the medical staff as a result of the fact that the main magnet system and the gradient magnet system are accommodated in two separate magnet units at a distance from each other. This particular embodiment of the invention is based on the insight that in an open type MRI system the mechanical and acoustic vibrations of the gradient magnet system are predominantly caused by mechanical torques exerted on the first and the second portion of the gradient magnet system about axes perpendicular to the Z-direction of the main magnetic field as a result of the electromagnetic interaction between the main magnetic field and the electrical currents in the gradient magnet system. As in this embodiment the first and the second portion of the gradient magnet system are each coupled to a separate balance member via a separate actuator system, and each actuator system exerts at least compensating mechanical torques about said first and said second axis of rotation upon the respective balance member substantially corresponding to the mechanical torques exerted on the respective portion of the gradient magnet system about said axes, said mechanical torques are substantially cancelled by the mechanical reaction torques exerted by the respective actuator system upon the respective portion of the gradient magnet system. In this manner a predominant portion of the mechanical and acoustic vibrations of the gradient magnet system is effectively reduced. The coupling device between each portion of the gradient magnet system and the respective balance member is relatively simple, because the coupling device needs to allow only rotations of the balance member about said first and second axes of rotation.

A further embodiment of an MRI system according to the invention is characterized in that each actuator system comprises three actuators which each exert a compensating force on the respective balance member in a direction parallel to the Z-direction. Said three actuators generate the necessary compensating mechanical torques about the first and the second axis of rotation extending perpendicular to the Z-direction, in a practical and efficient manner.

A further embodiment of an MRI system according to the invention is characterized in that the first and the second portion of the gradient magnet system are positioned in a portion of the respective magnet unit facing the examination volume, and in that the respective balance member is positioned at a side of the respective magnet unit remote from the examination volume, the respective portion of the gradient magnet system and the respective balance member being connected to each other via a connecting member which is accommodated in a central chamber provided in the respective magnet unit and in the respective portion of the main magnet system. At the side of each respective magnet unit remote from the examination volume a relatively large amount of space is available to position the balance member. At this side, in particular, portions of the balance member can be arranged at relatively large distances from the first and the second axis of rotation, so that relatively large moments of inertia about said axes are achieved with a limited total mass of the balance member. As a result, the angular displacements of the balance members about the first and the second axes of rotation, which are generated as a result of the compensating mechanical torques exerted on the balance members, are considerably reduced.

A further embodiment yet of an MRI system according to the invention is characterized in that each of the three actuators is a piezo-electric actuator arranged in the central chamber of the respective magnet unit. In this embodiment the available volume of the central chambers is effectively used to accommodate the piezo-electric actuators. An additional advantage is that the piezo-electric actuators are arranged at a relatively short distance from the first and the second axes of rotation. As a result, the longitudinal deformations of the piezo-electric actuators necessary to achieve predetermined rotations of the balance members about the first and the second axes of rotation are considerably limited, so that the necessary dimensions of the piezo-electric actuators are limited and the robustness of the piezo-electric actuators is increased.

A further embodiment of an MRI system according to the invention is characterized in that each balance member comprises an electrically conductive portion arranged in the central chamber of the respective magnet unit. In the central chamber of the first and the second magnet unit of an open type MRI system the magnetic field of the main magnet system has a relatively high strength. As a result, relatively strong eddy currents are generated in said electrically conductive portions, so that the electrically conductive portions provide a relatively strong damping effect and the displacements and vibrations of the balance members are further limited.

A further embodiment yet of an MRI system according to the invention is characterized in that the electrically conductive portion of each balance member comprises a cylindrical plate which is oriented substantially parallel to the Z-direction. In this embodiment the cylindrical plates in the central chambers are mainly oriented parallel to the direction of the magnetic field of the main magnet system. In this way optimal damping effects are achieved by the electrically conductive portions of the balance members.

A further embodiment still of an MRI system according to the invention is characterized in that each balance member comprises a massive cylindrical body which is arranged in the central chamber of the respective magnet unit, the respective cylindrical plate being mounted around said body. In this embodiment the moment of inertia of the balance member is reduced by the use of said massive cylindrical body. Said reduction is possible in view of the damping effect obtained by the cylindrical conductive plate mounted around said body. In this manner the balance members each have a compact structure, and the available volume of the central chambers of the first and the second magnet unit is effectively used to accommodate the balance members.

Figure 2:
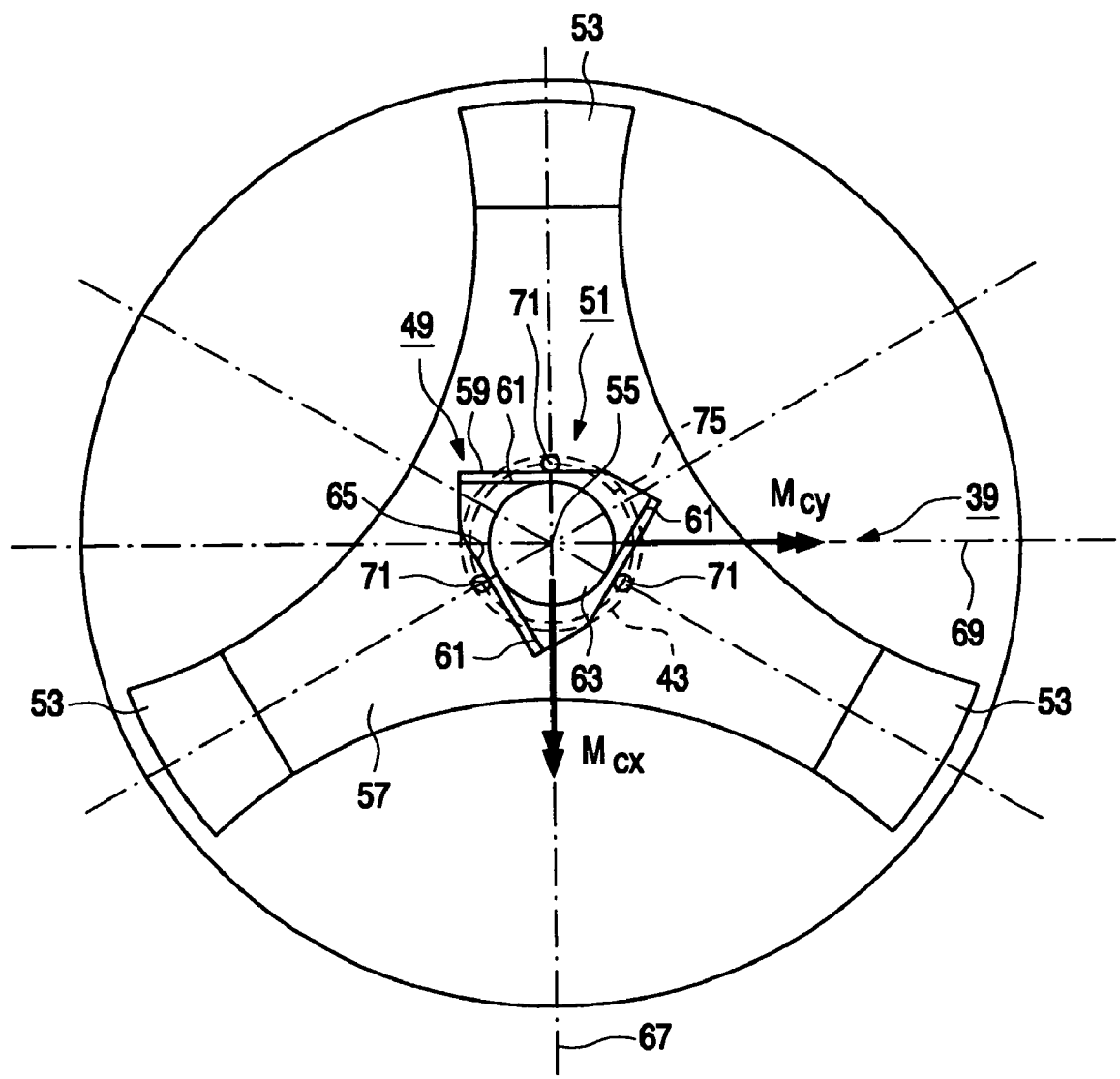
Figure 3:
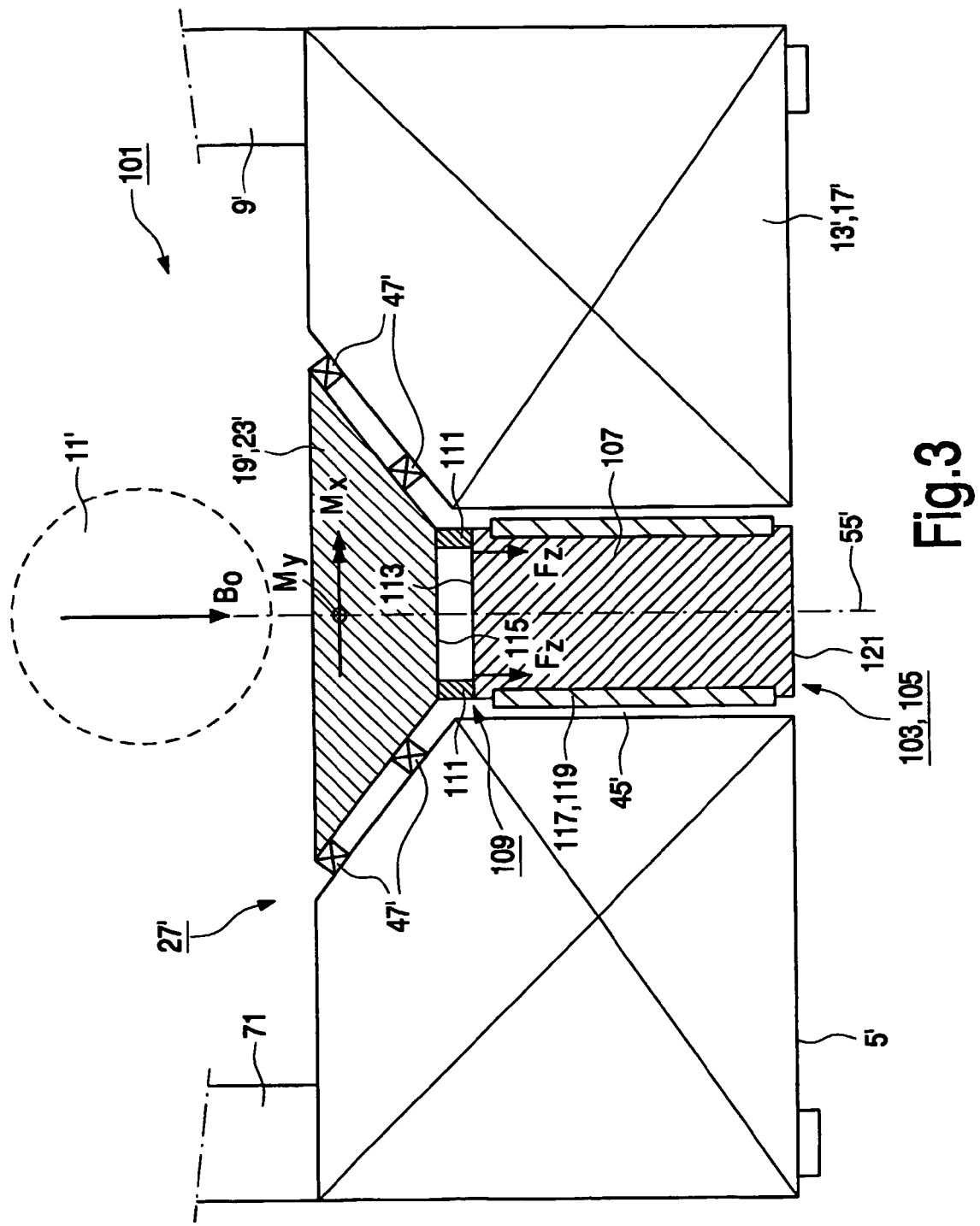

Embodiments of a magnetic resonance imaging (MRI) system according to the invention will be described hereinafter with reference to the figures, in which FIG. 1 schematically shows a cross-section of a first embodiment of an MRI system according to the invention, FIG. 2 schematically shows a plan view of a balance member of the MRI system of FIG. 1, and FIG. 3 schematically shows the main parts of a second embodiment of an MRI system according to the invention.

The first embodiment of an MRI system 1 according to the invention as shown in FIG. 1 is of the so-called open type and has an upper housing 3 and a lower housing 5 which are interconnected by means of two vertical posts 7, 9. Between the upper housing 3 and the lower housing 5 an examination volume 11 is present in which a patient to be examined can be positioned. The MRI system 1 also comprises a main magnet system 13 having a first portion 15 accommodated in the upper housing 3 and a second portion 17 accommodated in the lower housing 5. Said first and second portions 15, 17, which are not shown in detail in FIG. 1, each comprise a number of superconducting electrical coils accommodated in a cryogenic container. The main magnet system 13 generates a main magnetic field $B_0$ in the examination volume 11 during operation, which main magnetic field $B_0$ is substantially directed in a vertical Z-direction. The MRI system 1 also comprises a gradient magnet system 19 having a first portion 21, which is accommodated in the upper housing 3 between the first portion 15 of the main magnet system 13 and the examination volume 11, and a second portion 23, which is accommodated in the lower housing 5 between the second portion 17 of the main magnet system 13 and the examination volume 11. Said first and second portions 21, 23, which are not shown in detail in FIG. 1, each comprise a number of electrical coils for generating gradients of the main magnetic field $B_0$ in the examination volume 11 in three orthogonal directions X, Y, Z. The first portion 15 of the main magnet system 13 and the first portion 21 of the gradient magnet system 19 belong to a first magnet unit 25 accommodated in the upper housing 3, while the second portion 17 of the main magnet system 13 and the second portion 23 of the gradient magnet system 19 belong to a second magnet unit 27 accommodated in the lower housing 5 at a vertical distance from the first magnet unit 25. The first magnet unit 25 also comprises a first RF-coil unit 29, which is positioned between the first portion 21 of the gradient magnet system 19 and the examination volume 11, and a second RF-coil unit 31, which is positioned between the second portion 23 of the gradient magnet system 19 and the examination volume 11.

The MRI system 1 is used to make images of the internal organs of a patient's body by means of a nuclear magnetic resonance method. An image of the patient's body is constructed by successively observing nuclear magnetic resonance effects in a large number positions in the patient's body, which are successively selected by altering the gradients of the main magnetic field $B_0$. In each selected position an RF-signal is transmitted by the first and/or the second RF-coil unit 29, 31 and subsequently an RF-signal, which is generated as a result of a nuclear magnetic resonance effect in said position, is received by the first and/or the second RF-coil unit 29, 31. Since the main magnet system 13 comprises superconducting electrical coils, the main magnetic field $B_0$ is relatively strong, so that relatively strong nuclear magnetic resonance effects are achieved. In order to limit the overall period of time necessary for a complete examination, the gradients of the main magnetic field $B_0$ are altered at relatively high frequencies. For this purpose the electrical currents in the coils of the gradient magnet system 19 are also altered at high frequencies.

Since a portion of the magnetic field of the main magnet system 13 is present in the gradient magnet system 19, an electromagnetic interaction occurs between the magnetic field of the main magnet system 13 and the altering currents in the gradient magnet system 19. Said interaction leads to mechanical loads, in particular Lorentz forces, being exerted during operation on the coils of the gradient magnet system 19. Since the magnetic field of the main magnet system 13 is relatively strong and the currents in the gradient magnet system 19 are altered at relatively high frequencies, the Lorentz forces are relatively high. Without additional measures the Lorentz forces would lead to strong mechanical and acoustic vibrations of the gradient magnet system 19. Said vibrations would even be transmitted to other parts of the MRI system 1, in particular to the main magnet system 13 and to the upper and the lower housing 3, 5. Said vibrations would cause distortions of the main magnetic field $B_0$, which would result in inadmissible distortions of the images generated by the MRI system 1. Furthermore, inadmissibly high acoustic vibrations would occur in and around the MRI system 1.

In order to reduce and limit said mechanical and acoustic vibrations of the gradient magnet system 19, the MRI system 1 comprises an anti-vibration system 33. In the first embodiment of the MRI system 1 shown in FIG. 1 the anti-vibration system 33 comprises a separate first portion 35 for reducing the vibrations of the first portion 21 of the gradient magnet system 19 and a separate second portion 37 for reducing the vibrations of the second portion 23 of the gradient magnet system 19. In the following only the first portion 35 of the anti-vibration system 33 will be discussed in detail. The structure and operation of the second portion 37 of the anti-vibration system 33 is identical to the first portion 35. Furthermore a number of structural details of the first portion 21 of the gradient magnet system 19 will be discussed, and it will be clear that the second portion 23 of the gradient magnet system 19 has identical structural details.

As shown in FIG. 1, the first portion 35 of the anti-vibration system 33 comprises a balance member 39 which will be discussed in detail hereafter and which is positioned at a side 41 of the first magnet unit 25 remote from the examination volume 11. The first portion 21 of the gradient magnet system 19, which is positioned in a portion of the first magnet unit 25 facing the examination volume 11, is rigidly mounted to a cylindrical connecting member 43 which is accommodated in a central chamber 45 provided in the first magnet unit 25 and in the first portion 15 of the main magnet system 13. The first portion 21 of the gradient magnet system 19 is mounted to the first portion 15 of the main magnet system 13 via a number of mounting elements 47 which are provided on the connecting member 43 and are made of an elastically deformable material such as rubber. The balance member 39 is coupled to the connecting member 43 of the first portion 21 of the gradient magnet system 19 by means of a coupling device 49 which will be discussed in detail hereinafter, and by means of an actuator system 51 which will also be discussed in detail hereinafter.

FIG. 2 shows the balance member 39 in detail. In the embodiment shown the balance member 39 comprises three portions 53 which have a relatively high mass and which are positioned on an imaginary circle around a central axis 55 of the first magnet unit 25 extending parallel to the Z-direction. The portions 53 are interconnected by means of a triangular frame 57 having a central opening 59. The coupling device 49 comprises three flexible rods 61 extending in a horizontal imaginary plane perpendicular to the Z-direction. A first end portion of each rod 61 is connected to an end disc 63 of the connecting member 43 of the first portion 21 of the gradient magnet system 19. A second end portion of each rod 61 is connected to an inner wall 65 of the central opening 59 of the triangular frame 57. The three flexible rods 61 allow the balance member 39 to rotate relative to the first portion 21 of the gradient magnet system 19 about a first horizontal axis of rotation 67 which is perpendicular to the Z-direction, and about a second horizontal axis of rotation 69 which is perpendicular to the Z-direction and to the first axis of rotation 67. The actuator system 51 comprises three actuators 71 which are also arranged on an imaginary circle around the central axis 55 and which can each exert a compensating force $F_Z$ on the balance member 39 in a direction parallel to the Z-direction. In the embodiment of FIG. 1 and FIG. 2 each actuator 71 is a piezo-electric actuator which is arranged in the central chamber 45. A first end portion of each actuator 71 is connected, via a first elastic hinge 73, to an angular horizontal mounting surface 75 of the connecting member 43, while a second end portion of each actuator 71 is connected, via a second elastic hinge 77, to a mounting surface 79 of the triangular frame 57 which is present near the central opening 59. Via the three actuators 71 the actuator system 51 can exert compensating mechanical torques $M_{CX}$ and $M_{CY}$ (see FIG. 2) upon the balance member 39 about the first and the second axis of rotation 67, 69. The coupling device 49 allows said torques to be converted into rotations of the balance member 39 relative to the first portion 21 of the gradient magnet system 19 about the first and the second axis of rotation 67, 69. As the balance member 39 is positioned at the side 41 of the first magnet unit 25 remote from the examination volume 11, a relatively large amount of space is available for the balance member 39. As a result, the portions 53 can be positioned at a relatively large distance from the central axis 55. In this manner the balance member 39 has relatively large moments of inertia $I_X$ and $I_Y$ about the first and the second axis of rotation 67, 69, respectively, with a limited total mass of the balance member 39. As the piezo-electric actuators 71 are accommodated in the central chamber 45, the longitudinal deformations of the piezo-electric actuators 71 necessary to achieve predetermined rotations of the balance member 39 about the first and the second axis of rotation 67, 69 are considerably limited, so that the necessary dimensions of the piezo-electric actuators 71 are limited and the robustness of the piezo-electric actuators 71 is increased. An advantage of the use of piezo-electric actuators in the actuator system 51 is that the presence of the piezo-electric actuators 71 has substantially no effect on the main magnetic field $B_0$ in the examination volume 11 as piezo-electric actuators practically do not contain any electrically conductive materials.

The application of the described structure and properties of the balance member 39, the coupling device 49 and the actuator system 51 is based on the insight that in an open type MRI system, like the MRI system 1, the mechanical and acoustic vibrations of the gradient magnet system 19 are predominantly caused by mechanical torques $M_X$, $M_Y$ (see FIG. 1) which are exerted, because of the electromagnetic interaction between the magnetic field of the main magnet system 13 and the electrical currents in the gradient magnet system 19, on the first and the second portion 21,23 of the gradient magnet system 19 about axes directed perpendicular to the Z-direction. In the MRI system 1 according to the invention said mechanical torques $M_X$, $M_Y$ on the first portion 21 of the gradient magnet system 19 are substantially cancelled in that the compensating mechanical torques $M_{CX}$, $M_{CY}$, exerted on the balance member 39 by the actuator system 51, substantially correspond to said mechanical torques $M_X$, $M_Y$. As a result, mechanical reaction torques $M_{RX}$, $M_{RY}$ (see FIG. 1) are exerted by the actuator system 51 upon the first portion 21 of the gradient magnet system 19, which torques have the same magnitude as but are oppositely directed to said mechanical torques $M_X$, $M_Y$, so that the total mechanical torques exerted on the first portion 21 of the gradient magnet system 19 about axes perpendicular to the Z-direction are substantially zero. For this purpose the MRI system 1 comprises a control system 81 which is schematically shown in FIG. 1 and which controls each actuator 71 of the actuator system 51 in such a manner that the compensating mechanical torques $M_{CX}$, $M_{CY}$ exerted by the actuator system 51 on the balance member 39 substantially equal the mechanical torques $M_X$, $M_Y$. In order to calculate the momentary values of the necessary compensating mechanical torques $M_{CX}$, $M_{CY}$, the control system 81 has an input 83 for receiving a signal $u_1$ which corresponds to the values of the momentary electrical currents in the coils of the gradient magnet system 19. Said signal $u_1$ is supplied by a pulse sequence control unit 85 of the MRI system 1, which unit is not shown in detail in FIG. 1 and determines the electrical currents in the coils of the gradient magnet system 19 and the RF-signals to be transmitted by the RF-coil units 29, 31 according to a predetermined MRI pulse sequence program. On the basis of the signal $u_1$ and information about the strength and orientation of the magnetic field of the main magnet system 13, which information is stored in a memory of the control system 81, the control system 81 predicts the momentary values of the mechanical torques $M_X$, $M_Y$. Subsequently, the control system 81 determines the deformations of the piezo-electric actuators 71 necessary to achieve the necessary compensating mechanical torques $M_{CX}$, $M_{CY}$. The control system 81 calculates said deformations on the basis of the predicted values of the mechanical torques $M_X$, $M_Y$, the moments of inertia $I_X$, $I_Y$ of the balance member 39, and the necessary angular displacements of the balance member 39. Finally, the control system 81 applies a control signal $u_D$ corresponding to the necessary deformations to each individual actuator 71 of the actuator system 51. An advantageous property of the piezo-electric actuators 71 is that the control signal $u_D$ has a relatively small current value, so that the control signal $u_D$ causes only relatively small disturbing magnetic fields. It will be clear that the mechanical torques $M_X$, $M_Y$ on the second portion 23 of the gradient magnet system 19 are cancelled in a similar manner by means of the second portion 37 of the anti-vibration system 33.

As a result of the balance member 39, the actuator system 51, and the control system 81, a predominant portion of the mechanical and acoustic vibrations of the first portion 21 of the gradient magnet system 19, in particular the predominant angular vibrations about axes perpendicular to the Z-direction, is reduced in an effective manner. The compensating mechanical torques $M_{CX}$, $M_{CY}$ exerted on the balance member 39 are converted into angular displacements of the balance member 39 about the first and the second axis of rotation 67, 69. As the moments of inertia $I_X$, $I_Y$ of the balance member 39 are relatively high, said angular displacements of the balance member 39 and the vibrations of the balance member 39 resulting therefrom are relatively small and do not lead to appreciable acoustic vibrations of the balance member 39. In order to reduce the sound caused by the vibrations of the balance member 39 a suitable sound insulation means can be provided around the balance member 39. An example of such a sound insulation means is a vacuum chamber wherein the balance member 39 is arranged. An important advantage is that the balance member 39 is not mechanically coupled to any part of the MRI system 1 other than the first portion 21 of the gradient magnet 19, so that the resultant vibrations of the balance member 39 are not mechanically transmitted to any other part of the MRI system 1. The coupling device 49 and the actuator system 51 have simple structures since in this embodiment only angular displacements of the balance member 39 about the first and the second axis of rotation 67, 69 are to be generated.

In the embodiment shown in FIG. 1 residual angular vibrations of the first portion 21 of the gradient magnet system 19 about axes perpendicular to the Z-direction are further reduced in that the gradient magnet system 19 is provided with a sensor system 87 which measures said residual vibrations during operation. The sensor system 87 applies a measuring signal $u_{RV}$ corresponding to said measured residual vibrations to the control system 81. The sensor system 87 belongs to a feedback control loop of the control system 81 which adjusts the control signal $u_D$ applied to the actuator system 51 in such a manner that the measured residual vibrations are kept smaller than a predetermined threshold value. Such residual vibrations may occur as a result of, for example, differences between the mechanical torques $M_X$, $M_Y$ actually experienced by the first portion 21 of the gradient magnet system 19 and the values of the mechanical torques $M_X$, $M_Y$ predicted by the control system 81. As a result of the use of said feedback control loop, including the sensor system 87, the efficiency of the first portion 35 of the anti-vibration system 33 is further improved. It will be clear that residual angular vibrations of the second portion 23 of the gradient magnet system 19 about axes perpendicular to the Z-direction are further reduced in a similar manner.

FIG. 3 schematically shows a second embodiment of an MRI system 101 according to the invention, which is also of the open type. Parts of the MRI system 101, which correspond to parts of the MRI system 1 as described before are indicated by corresponding reference numerals in FIG. 3 and will not be discussed in detail. FIG. 3 schematically shows the main parts in the lower housing 5' accommodating the second magnet unit 27' of the MRI system 101. The upper housing accommodating the first magnet unit is not shown in FIG. 3, but a person skilled in the art will understand that the upper housing and the first magnet unit are substantially identical to the lower housing 5' and the second magnet unit 27'. In the following only the main differences between the MRI system 101 and the MRI system 1 will be briefly discussed.

As shown in FIG. 3, the MRI system 101 comprises an anti-vibration system 103 comprising a second portion 105 for canceling the mechanical torques $M_X$, $M_Y$ exerted on the second portion 23' of the gradient magnet system 19' as a result of the electromagnetic interaction between the magnetic field of the main magnet system 13' and the electrical currents in the second portion 23' of the gradient magnet system 19'. A person skilled in the art will understand that a first portion of the anti-vibration system 103, which is not shown in FIG. 3 and is used to cancel the mechanical torques $M_X$, $M_Y$ exerted on the first portion of the gradient magnet system, is substantially identical to the second portion 105. The second portion 105 of the anti-vibration system 103 comprises a balance member 107 which comprises a massive cylindrical body arranged in the central chamber 45' of the second magnet unit 27'. The balance member 107 is coupled to the second portion 23' of the gradient magnet system 19' by means of an actuator system 109 and by means of a coupling device which allows rotations of the balance member 107 relative to the second portion 23' of the gradient magnet system 19' about axes perpendicular to the Z-direction. The coupling device is not shown in FIG. 3, but the a person skilled in the art will know how to construct a suitable coupling device, for example, on the basis of the foregoing disclosure of the coupling device 49 of the MRI system 1. The actuator system 109 is comparable with the actuator system 51 of the MRI system 1 and comprises three piezo-electric actuators 111 which can each exert a compensating force $F_Z$ on the balance member 107 in a direction parallel to the Z-direction. In FIG. 3 only two actuators 111 are schematically shown. The actuators 111 are mounted between a horizontal mounting surface 113 of the balance member 107 and a horizontal mounting surface 115 of the second portion 23' of the gradient magnet system 19'. The actuators 111 are controlled by a control system of the MRI system 101, which is not shown in FIG. 3 and which applies a control signal to each individual actuator 111 corresponding to a calculated deformation of the actuator 111.

The balance member 107 has a compact structure, and the available volume of the central chamber 45' is effectively used to accommodate the balance member 107, the coupling device and the actuator system 109. As a result, however, the moments of inertia $I_X$, $I_Y$ of the balance member 107 about axes perpendicular to the Z-direction are relatively small. In the MRI system 101, however, the angular displacements of the balance member 107 are limited since the balance member 107 comprises an electrically conductive portion 117 which is positioned in a portion of the magnetic field of the main magnet system 13'. In the embodiment shown in FIG. 3 the electrically conductive portion 117 of the balance member 107 comprises a cylindrical plate 119 which is also arranged in the central chamber 45' and is mounted around the massive cylindrical body of the balance member 107. The plate 119 is made of a material having a relatively high electrical conductivity, such as copper. It will be understood that the first portion of the anti-vibration system 103 comprises a similar electrically conductive portion. In the central chamber 45' the magnetic field of the main magnet system 13' is relatively strong and is oriented substantially parallel to the Z-direction. When the balance member 107 is displaced relative to the second portion 23' of the gradient magnet system 19' by means of the actuator system 109, eddy currents are generated in the electrically conductive portion 117 by the magnetic field of the main magnet system 13'. The electromagnetic interaction between said magnetic field and said eddy currents causes Lorentz forces to be exerted on the electrically conductive portion 117 in a direction opposite to the direction in which the electrically conductive portion 117 is displaced. Said Lorentz forces thus have a damping effect on the angular displacements of the balance member 107, e.g. said displacements are limited as a result of the presence of the electrically conductive portion 117. Since the magnetic field of the main magnet system 13' in the central chamber 45' is relatively strong, said damping effect is also relatively strong, so that the angular displacements of the balance member 107 are relatively small despite the relatively small moments of inertia $I_X$, $I_Y$ of the balance member 107. A further advantage of the embodiment of FIG. 3 is that the cylindrical plate 119 is oriented parallel to the Z-direction, i.e. substantially parallel to the local direction of the magnetic field of the main magnet system 13' in the central chamber 45'. As a result an optimal damping effect is achieved by the electrically conductive portion 117. The control system of the MRI system 101 determines the control signals supplied to each individual actuator 111 not only as a function of the predicted mechanical torques $M_X$, $M_Y$ exerted on the second portion 23' of the gradient magnet system 19', but also as a function of a predicted value of the damping force generated by the electrically conductive portion 117. Said damping force depends in a predetermined manner on the angular velocities of the electrically conductive portion 117, and a person skilled in the art will know how to adapt the control system in order to take into account the damping force.

It is preferred to arrange the electrically conductive portion 117 of the balance member 107 in a position which is situated as far as possible from the examination volume 11. The effect of the eddy currents in the electrically conductive portion 17 on the main magnetic field $B_0$ in the examination volume 11 is thus minimized. Therefore, in a preferred further embodiment of an MRI system according to the invention, which is not shown in the FIGS, the cylindrical plate 119 only extends around the lower half portion of the balance member 107 which is remote from the examination volume 11. In this further embodiment the damping effect may be increased by the addition of an electrically conductive end plate at the location of the end surface 121 of the balance member 107.

It is noted that the invention also covers magnetic resonance imaging (MRI) systems of the so-called closed cylindrical type which comprise a single cylindrical magnet unit enclosing a cylindrical examination volume. The gradient magnet system of an MRI system of the closed cylindrical type usually comprises a single cylindrical gradient coil system. Accordingly, the anti-vibration system of a closed type MRI system according to the invention may comprise a single balance member only, which is coupled to said gradient coil system by means of a single suitable coupling device and a single suitable actuator system. In order to compensate internal mechanical bending torques, which are characteristic of the gradient magnet system of a closed type MRI system, a closed type MRI system may also be provided with two or more balance members coupled to the gradient magnet system.

In the described MRI systems 1 and 101 the anti-vibration systems 33, 103 are used to cancel the mechanical torques $M_X$, $M_Y$ which are exerted on the first and second portions 21, 21', 23, 23' of the gradient magnet system 19, 19' about axes perpendicular to the Z-direction. Finally it is noted that the invention also covers magnetic resonance imaging (MRI) systems in which the anti-vibration system is used to cancel other mechanical loads exerted on the gradient magnet system as a result of electromagnetic interaction between the magnetic field of the main magnet system and the electrical currents in the gradient magnet system, such as the net linear forces. In such embodiments a suitable coupling device should be provided, which allows the necessary linear displacements of the balance member relative to gradient magnet system, and a suitable actuator system should be provided which allows the necessary compensating mechanical loads (forces) to be exerted on the balance member. A person skilled in the art will be able to design a suitable coupling device and a suitable actuator system in conformity with the kind of mechanical loads to be compensated.

The invention claimed is:

1. A magnetic resonance imaging (MRI) system comprising an examination volume, a main magnet system for generating a main magnetic field in the examination volume in a Z-direction, a gradient magnet system for generating gradients of the main magnetic field, and an anti-vibration system for reducing vibrations of the gradient magnet system caused, during operation, by a mechanical load exerted on the gradient magnet system as a result of electromagnetic interaction between the main magnetic field and electrical currents in the gradient magnet system, wherein the anti-vibration system comprises a balance member, which is coupled to the gradient magnet system by means of an actuator system and a coupling device allowing displacements of the balance member relative to the gradient magnet system, the MRI system having a control system for controlling the actuator system in such a manner that, during operation, the actuator system exerts upon the balance member a compensating mechanical load which substantially corresponds to the mechanical load exerted on the gradient magnet system.

2. An MRI system as claimed in claim 1, wherein, during operation, the control system applies a control signal to the actuator system corresponding to the compensating mechanical load, the control system determining said control signal as a function of the value of the electrical currents in the gradient magnet system.

3. An MRI system as claimed in claim 2, wherein the gradient magnet system comprises a sensor system which, during operation, measures residual vibrations of the gradient magnet system and which applies a measuring signal to the control system corresponding to the measured residual vibrations, the control system adjusting the control signal in such a manner that the measured residual vibrations are smaller than a predetermined threshold value.

4. An MRI system as claimed in claim 1, wherein the actuator system comprises piezo-electric actuators.

5. An MRI system as claimed in claim 4, wherein each of the three actuators is a piezo-electric actuator arranged in the central chamber of the respective magnet unit.

6. An MRI system as claimed in claim 1, wherein the balance member comprises an electrically conductive portion which is positioned in a portion of the magnetic field of the main magnet system.

7. An MRI system as claimed in claim 6, wherein each balance member comprises an electrically conductive portion arranged in the central chamber of the respective magnet unit.

8. An MRI system as claimed in claim 7, wherein the electrically conductive portion of each balance member comprises a cylindrical plate which is oriented substantially parallel to the Z-direction.

9. An MRI system as claimed in claim 8, wherein each balance member comprises a massive cylindrical body which is arranged in the central chamber of the respective magnet unit, the respective cylindrical plate being mounted around said body.

10. An MRI system as claimed in claim 1, wherein the MRI system has a first magnet unit and a second magnet unit at a distance from the first magnet unit, the examination volume being present between the first and the second magnet unit, wherein the first and the second magnet unit comprise a first portion and a second portion, respectively, of the main magnet system and a first portion and a second portion, respectively, of the gradient magnet system, and wherein the first and the second portion of the gradient magnet system are each coupled to a separate balance member by means of a separate actuator system and a separate coupling device allowing at least rotations of the respective balance member relative to the respective portion of the gradient magnet system about a first and a second axis of rotation which are mutually perpendicular and perpendicular to the Z-direction, the control system controlling each actuator system in such a manner that, during operation, each actuator system exerts upon the respective balance member at least compensating mechanical torques about the first and the second axis of rotation which substantially correspond to mechanical torques exerted on the respective portion of the gradient magnet system as a result of the electromagnetic interaction between the main magnetic field and the electrical currents in the respective portion of the gradient magnet system.

11. An MRI system as claimed in claim 10, wherein each actuator system comprises three actuators which each exert a compensating force on the respective balance member in a direction parallel to the Z-direction.

12. An MRI system as claimed in claim 10, wherein the first and the second portion of the gradient magnet system are positioned in a portion of the respective magnet unit facing the examination volume, and in that the respective balance member is positioned at a side of the respective magnet unit remote from the examination volume, the respective portion of the gradient magnet system and the respective balance member being connected to each other via a connecting member which is accommodated in a central chamber provided in the respective magnet unit and in the respective portion of the main magnet system.

* * * * *